United States Patent [19]

Hanmura

[11] 4,369,504
[45] Jan. 18, 1983

[54] SERIAL-PARALLEL SIGNAL CONVERTER

[75] Inventor: Hisao Hanmura, Hitachi, Japan

[73] Assignee: Hitachi, Ltd., Tokyo, Japan

[21] Appl. No.: 142,127

[22] Filed: Apr. 21, 1980

[30] Foreign Application Priority Data

Apr. 25, 1979 [JP] Japan .................................. 54/50331

[51] Int. Cl.³ ............................................. G11C 11/40
[52] U.S. Cl. .................................... 365/238; 365/189;
365/227
[58] Field of Search ........................ 365/238, 189, 227

[56] References Cited

U.S. PATENT DOCUMENTS 3,953,837 4/1976 Cheek, Jr. ............................ 365/238
4,092,734 5/1978 Collins et al. ........................ 365/238

Primary Examiner—Terrell W. Fears
Attorney, Agent, or Firm—Antonelli, Terry & Wands

[57] ABSTRACT

A serial-parallel converter for storing sequentially a serially input digital signal in a predetermined number of elements and producing the stored data at one time as a parallelly output digital signal. The serially input digital signal is sequentially written in memory cells having addresses designated by an address counter adapted to count the write-in timing pulses. Upon completion of the write-in operation to all the memory cells, contents stored in all the memory cells are read out at one time as a parallelly output signal.

7 Claims, 6 Drawing Figures

SERIAL-PARALLEL SIGNAL CONVERTER

The present invention relates to a serial-parallel signal converter for storing serially input digital data of a predetermined length in a predetermined number of storage elements and producing the whole stored data as a parallelly output digital signal at one time for a parallel transmission to an output device such as a visual display.

In a display system, a line memory is commonly employed for storing a line of data to be displayed. Such a line memory requires a serial-parallel converter for converting an input digital signal received serially into a corresponding output digital signal produced in parallel as a whole.

As the serial-parallel converter, there has been used a shift register such as the one disclosed in U.S. Pat. No. 3,886,403 in FIG. 6, for example. More specifically, a serially input digital signal is stored in the shift register through successive shifting of the input signal. When the digital signal of a predetermined length has been stored in the shift register, the whole stored contents are transferred at one time to a buffer register having bit positions corresponding to those of the shift register. The contents thus placed in the buffer register constitute a parallelly output digital signal converted from the serially input digital signal.

The shift register and the buffer register are generally implemented in a form of CMOS-IC (complementary metal oxide semiconductor integrated circuit) in view of a relatively low electric energy consumption. Certainly, the power consumption of a CMOS-IC is extremely low unless a switching operation is performed. However, a CMOS-IC will of course consume a certain quantity of electric energy at the instant when the switching operation takes place. In the case of the shift register in which the signal or data is successively or sequentially shifted, the switching operation has to be carried out inherently at a relatively high frequency. Accordingly, when the shift register of the CMOS type is to be implemented with a large storage capacity, there will arise a problem in respect of the power consumption.

By way of example, a liquid crystal display device of a small size can be realized with a low power consumption less than several milliwatts by using a CMOS-IC, since the liquid crystal itself consume the electric power only to a small extent. However, in the case of a display device having a large number of picture elements, such as a display for a television image, for example, power consumption at a shift register circuit portion will amount to a considerable value. Even when a liquid crystal panel is employed, the power consumption of the whole display device often exceeds several watts, involving a problem to be solved.

Accordingly, an object of the present invention is to provide a serial-parallel signal converter of which the power consumption is significantly decreased.

According to a general aspect of the invention, a memory device composed of a plurality of memory cells is used, wherein the data write-in operation is effected only to the memory cell designated by an address signal with all the other memory cells remaining in the quiescent state. The address signal for designating the memory cell to which the data write-in operation is to be made is produced by counting the timing pulses for the write-in operation.

According to another feature of the invention, the memory cells are arrayed in a matrix configuration. A few bits of the least significance of an address counter for producing the addresses of the memory cells are used to designate a row (X) number of the matrix, while the most significant bits of the address counter are used to designate a column number of the matrix. Data is sequentially written in the memory cells located at points corresponding to the intersections between the rows and the columns sequentially designated in this manner.

According to a further feature of the invention, latch flip-flops are provided in correspondence to the individual memory cells. When the write-in operations to all the memory cells have been completed, the contents stored in all the memory cells are transferred at one time to the corresponding latch flip-flops.

The above and other objects, features and advantages of the invention will become more apparent from the following description of exemplary embodiments of the invention taken in conjunction with the accompanying drawings, in which.

In the first place, description will be made on a matrix type display apparatus to which the present invention can be applied, by referring to FIGS. 1 and 2.

Figure 1:
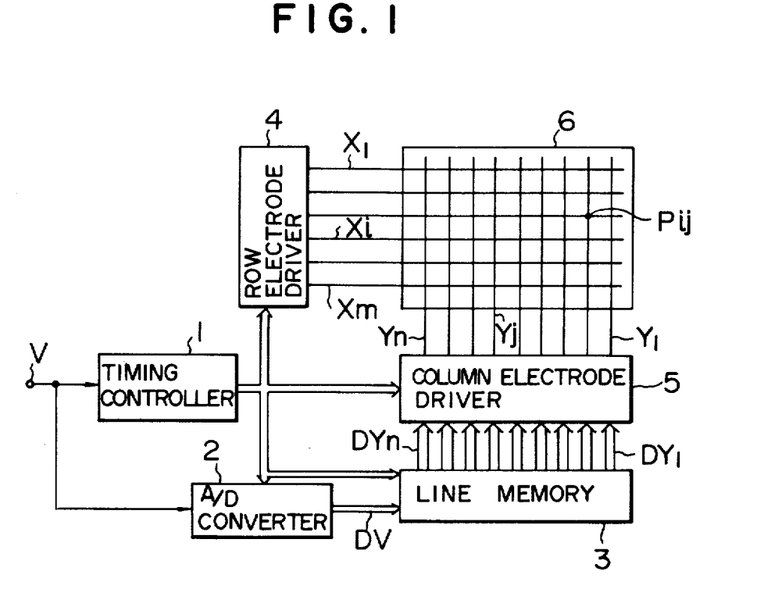
FIG. 1 is a block diagram to show a conventional matrix type display device to which the invention can be applied.
Figure 2:
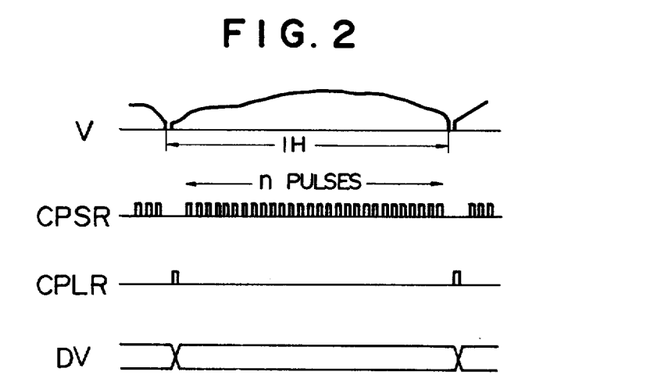
FIG. 2 is a signal waveform diagram to illustrate operations of circuits shown in FIG. 1.

Referring to FIG. 1, the matrix type display apparatus comprises a timing control circuit 1, an analog-to-digital converter 2 (referred to also as A/D converter), a line memory 3 including a serial-parallel converter, a row electrode driver circuit 4, a column electrode driver circuit 5 and a display panel 6.

Video signal V applied to the input terminal of the display apparatus can be supplied from a television receiver, VTR, television camera or the like (not shown). The timing control circuit 1 serves to separate a synchronizing signal from the video signal V and generates control signals as required for operations of the various parts as described above on the basis of the synchronizing signal. The control signals include a write signal CPSR and a latch signal CPLR which are supplied to the line memory 3 and have waveforms illustrated in FIG. 2.

The video signal V is additionally supplied to the A/D converter 2 and sampled at a predetermined frequency (e.g. 8 MHz) to be converted into a digital video data signal DV of l bits (usually 4 to 8 bits, inclusive). The digital video data signal DV thus obtained in supplied to the line memory 3, whereby data or information of the video signal V corresponding to a single scanning line is stored in the line memory 3. In this connection, it is assumed that the period of the single scanning line is 63.5 $\mu$s for the sampling frequency of 8 MHz and is represented by 1H as indicated in FIG. 2. When the A/D conversion is effected at the sampling frequency of 8 MHz as described above, 508 samplings will be performed during the period of 1H. Consequently, except for the horizontal blanking interval, the data to be displayed comprises n words for every 1H where n is equal to 340.

The line memory 3 is imparted with a storage bit capacity corresponding to n×l and loaded with the digital video data signal DV in synchronism with the write signal CPSR described above. The data placed in the line memory 3 in correspondence to the single scanning line is read out during the succeeding period 1H in synchronism with the latch signal CPLR and constitutes brightness control signals $DY_1, \ldots, DY_j, \ldots, DY_n$ (each signal $DY_j$ being of l bits) to be supplied to the column electrode driver 5.

The column electrode driver circuit 5 in turn derives from the input signal $DY_j$ of l bits a signal for driving an associated column electrode $Y_j$ (j=1 to n) of the display panel 6 for controlling the brightness of an image produced on the display panel 6.

On the other hand, the row electrode driver circuit 4 derives from the output of the timing controller 1 the signals which are selectively applied to row electrodes $X_i$ (i=1 to m) of the display panel 6 so that selected one of the row electrodes is electrically energized while the other remain in the non-selected or de-energized state. Selection of the row electrode is changed over for every period of 1H to thereby effect the scanning of the display panel 6.

Figure 3:
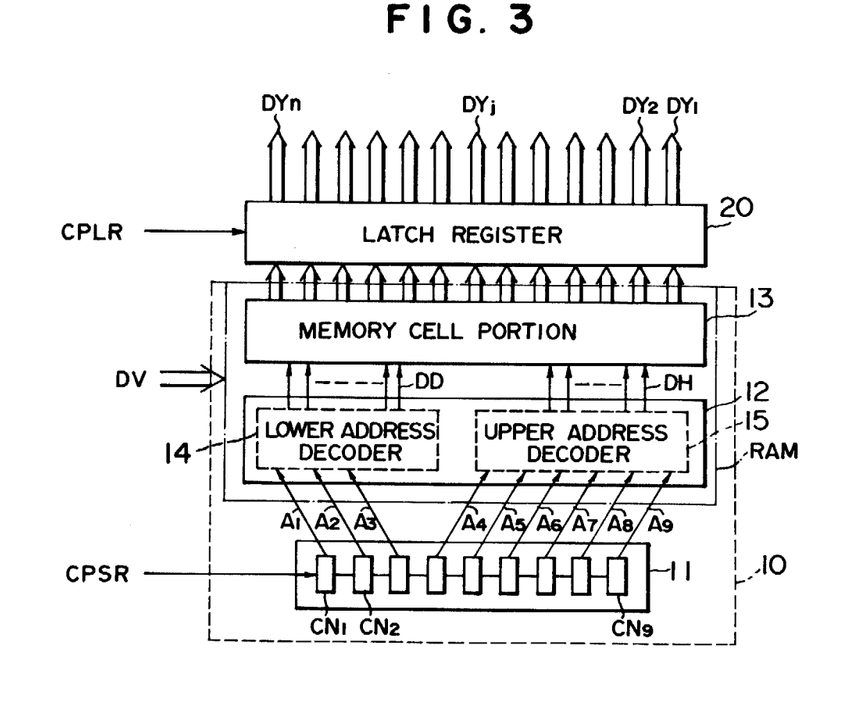
FIG. 3 is a block diagram to show an exemplary embodiment of a line memory according to the invention.

FIG. 3 shows in a block diagram an exemplary embodiment of the invention applied to a line memory such as the one described above.

Referring to FIG. 3, the line memory according to the invention is composed of a serial-parallel converter 10 and a latch register 20.

The serial-parallel converter 10 includes an address counter 11, an address decoder 12 composed of a lower address decoder section 14 and an upper address decoder section 15, and a memory cell portion 13.

The address decoder 12 and the memory cell portion 13 are implemented in a semiconductor memory of RAM type (Random Access Memory).

The write signal CPSR described hereinbefore is applied to the inputs of the address counter 11 of 9 bits $CN_1$ to $CN_9$, whereby address signals each of 9 bits $A_1$ to $A_9$ is generated from the address counter 11. In general, the number of bits required for the address counter 11 is expressed by $\log_2 n$. In the case of the exemplary embodiment now being described, 9 bits are required for the address counter 11 on the assumption that n is equal to 340, as described hereinbefore.

The memory cell portion 13 includes individual memory cells arrayed in a matrix configuration in number of l·n corresponding to the storage capacity described hereinbefore. Write in operation to any given cells can be effected through corresponding combinations of the column drive signals DD in number of $\sqrt{l \cdot n}$ with the same number of the row drive signals DH.

For preparing the drive signals described above, the upper address decoder section 15 of the address decoder 12 is supplied with the more significant (or upper) address signals $A_4$ to $A_9$ which are decoded to generate the column drive signals in number of $\sqrt{l \cdot n}$, while the lower address decoder section 14 of the address decoder 12 is supplied with the less significant (or lower) address signals $A_1$ to $A_3$ to thereby produce the row drive signals DD.

The output signals from the memory cell 13 having the storage capacity of l·n bits are supplied to the latch register 20 having the same bit number. The latch signal CPLR is made use of as the clock input signal to the latch register 20. The output signals from the latch register 20 constitute the brightness command or control signals $DY_1$ to $DY_n$ with each signal $DY_j$ being of l bits, as described hereinbefore.

Figure 4:
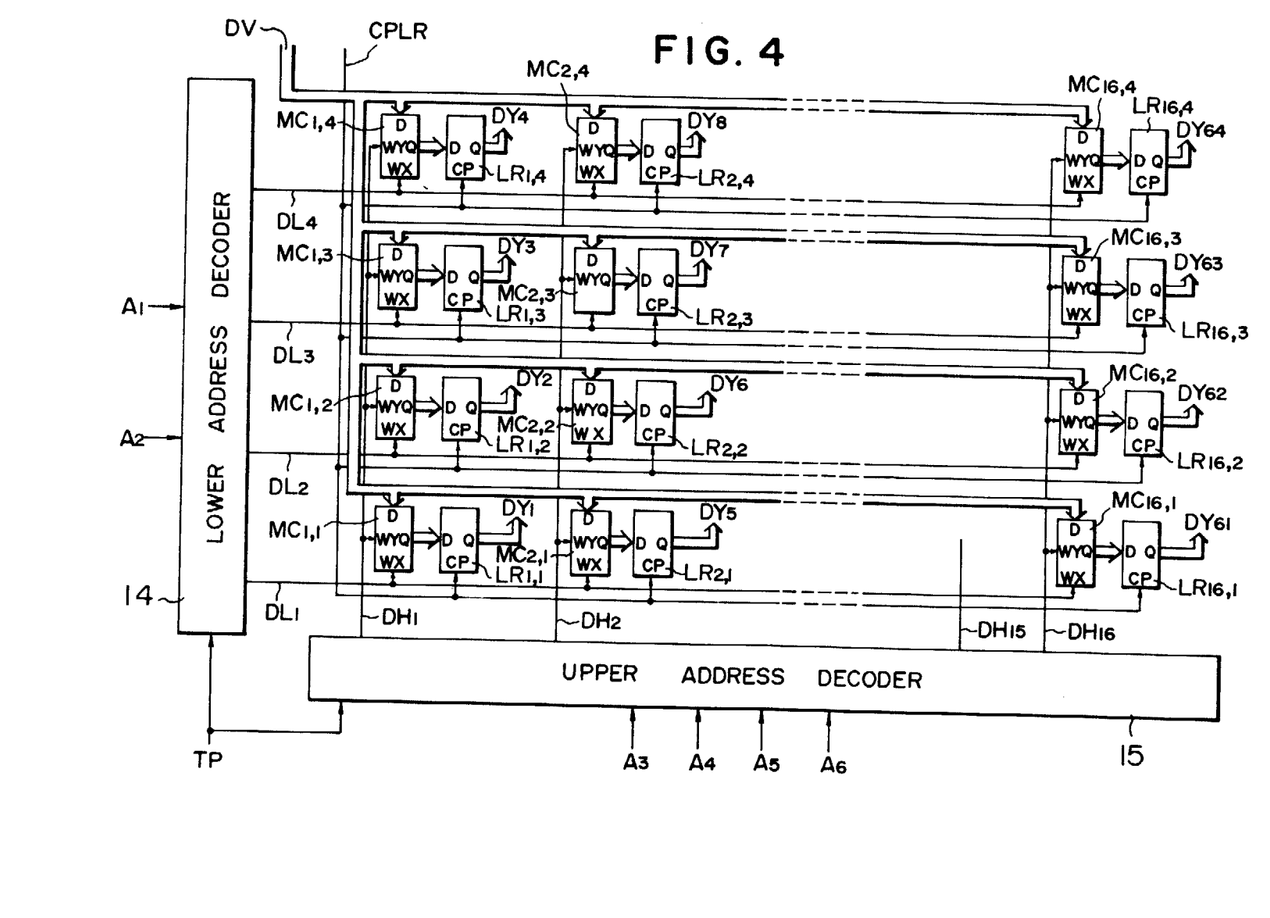
FIG. 4 is a block diagram showing in some detail an arrangement of the memory shown in FIG. 3.

FIG. 4 illustrates, by way of example, a detailed arrangement of a portion of the line memory shown in FIG. 3. With a view to having a better understanding of the invention, it is assumed that l is equal to 4, while n is equal to 64. Consequently, each of the address signals is composed of 6 bits $A_1$ to $A_6$ ($2^6 = 64$) of which the four most significant bits $A_3$ to $A_6$ are applied to the inputs of the upper address decoder section 15 which will then decode the input address bit signals to thereby set one of the 16 column drive signals $DH_1$ to $DH_{16}$ to logic "1" level with the other column drive signals being set to logic "0" level.

The two least significant bits $A_1$ and $A_2$ of the address signal are supplied to the lower address decoder section 14 which will then set one of the four row drive signals $DL_1$ to $DL_4$ to logic "1" with all the other row drive signals being set to logic "0" level.

Each of cross-points or intersections between the column drive signals $DH_i$ (i=1 to 16) and the row drive signals $DD_j$ (j=1 to 4) includes a four-bit memory cell $MC_{i,j}$ and a latch flip-flop $LR_{i,j}$ which is allotted with four bits of the latch register 20.

The column drive signal $DH_1$ is coupled to the write enable gates WY of the memory cells $MC_{1,1}$, $MC_{1,2}$, $MC_{1,3}$ and $MC_{1,4}$, respectively, while the row drive signal $DL_1$ is coupled to the write enable gates WX of the memory cells $MC_{1,1}$, $MC_{2,1}$, ..., $MC_{16,1}$.

The data signal DV of four bits is coupled to the data input terminals D of all the memory cells $MC_{i,j}$.

Each of the memory cells $MC_{i,j}$ allows the data at the respective data input terminal D to be written therein only when the outputs from both the associated write enable gates WY and WX are logic "1's". Otherwise, the write-in of data is inhibited, whereby the state of the memory cell is held unchanged. For example, when $DH_1$ is logic "1" concurrently with $DL_1$ being also logic "1", then the current four-bit data signal DV is allowed to be written in the memory cell $MC_{1,1}$.

The address counter 11 serves to count the write signal CPSR. The two least significant bits $A_1$ and $A_2$ are updated to "0;0", "1;0", "0;1" and "1;1" successively for every application of the write signal CPSR with this updating cycle being repeated.

The bit contents "0;0", "1;0", "0;1" and "1;1" in the lower address decoder section 14 correspond to the logic states "1" of the column drive signals $DL_1$, $DL_2$, $DL_3$ and $DL_4$, respectively.

The more significant bits $A_3$ to $A_6$ are incremented by (+) 1 every time when the updating cycle of the lower or less significant bits is repeated, whereby the column drive signal $DH_1$ of logic "1" is generated whent the more significant bits $A_3$, $A_4$, $A_5$ and $A_6$ are logic "0", "0", "0" and "0", respectively, while the column drive signal $DH_{16}$ is set to the logic "1" level when the bits $A_3$, $A_4$, $A_5$ and $A_6$ are all logic "1's". In this manner, every time when the write signal CPSR is applied, the four-bit data signal DV is successively and sequentially written in $MC_{1,1}$, $MC_{1,3}$, $MC_{1,4}$, $MC_{2,1}$ ..., $MC_{16,1}$, $MC_{16,2}$, $MC_{16,3}$ and then $MC_{16,4}$.

It should be noted that the data output terminals Q of the memory cells $MC_{i,j}$ are connected to the data input terminals D of the flip-flops $LR_{i,j}$ constituting the latch register. Further, the clock terminals CP of all the flip-flops $LR_{i,j}$ are adapted to be supplied with the latch signal CPLR, whereby the contents in the individual memory cells is simultaneously transferred to the latch register ($LR_{1,1}$ to $LR_{16,4}$) in response to the applied latch signal CPLR.

The signal appearing at the data output terminal Q of the flip-flop $LR_{1,1}$ of the latch register provides the brightness command or control signal $DY_1$ of four bits. In this manner, sixty four brightness control signals $DY_1$, $DY_2$, ..., $DY_{64}$ each of 4 bits are produced by the flip-flops $LR_{1,1}$, ..., $LR_{16,4}$ of the latch register.

In FIG. 4, reference character TP represents a timing signal with which the write signal CPSR is synchronized and which serves to determine the timing at which the column drive signal DL and the row drive signal DH are to be produced from the lower address decoder 14 and the upper address decoder 15, respectively, as well as the pulse width of these drive signals.

As will be appreciated from the above description with reference to FIG. 4, data is successively and sequentially written in the individual four-bit memory cells on the cell-by-cell basis. When data has been written in all the memory cells, the stored data is then transferred at one time to the latch register ($LR_{1,1}$ to $LR_{16,4}$) by the latch signal CPLR.

Figure 5:
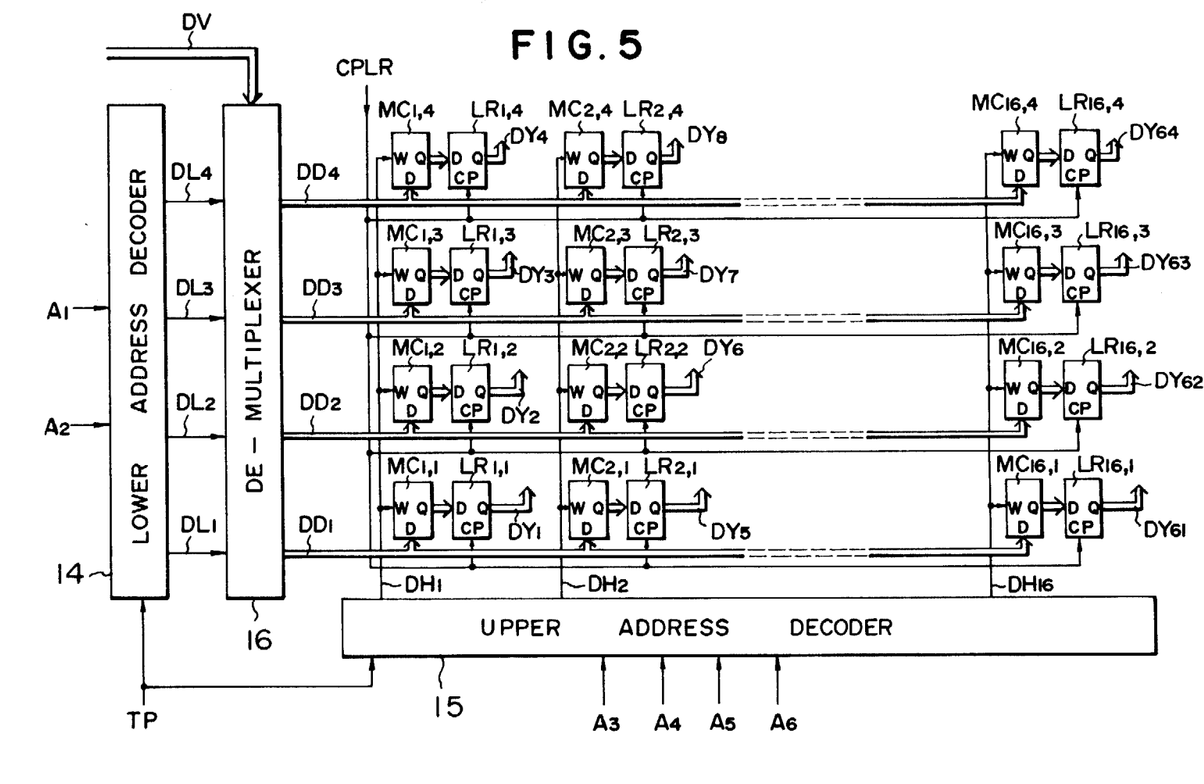
FIG. 5 is a block diagram showing in some detail another arrangement of the memory according to the invention.

FIG. 5 shows in a block diagram an arrangement of the line memory according to another embodiment of the invention which differs from the one shown in FIG. 4 in that a demultiplexer 16 is provided and that the memory cell $MC_{i,j}$ has only one write enable terminal W.

The demultiplexer 16 is supplied with the row drive signals $DL_1$, ..., $DL_4$ and the four-bit data signal DV, whereby corresponding four-bit data signal $DD_1$, $DD_2$, $DD_3$ or $DD_4$ is produced to the row corresponding to one of the two drive signals $DL_1$, ..., $DL_4$. For example, when the row drive signal $DL_1$ is logic "1", the data signal DV is produced to a data signal line also labelled by $DD_1$ with all the other data signal lines $DD_2$ to $DD_4$ being in the idle or reset state.

In a similar manner, when the row drive signal $DL_2$ is logic "1", the data signal DV is produced to the corresponding data signal line $DD_2$ while all the other data signal lines $DD_1$, $DD_3$ and $DD_4$ are in the reset state.

The memory cell $MC_{i,j}$ (i=1 to 16, j=1 to 4) is loaded with the data which is available at the time when the data signal line $DD_j$ is selected by the column drive signal $DH_i$ of logic "1" level.

Since the data signal lines $DD_1$ to $DD_4$ are sequentially selected in repeated cycles, the data signals are sequentially written in the memory cells $MC_{1,1}$, $MC_{1,2}$, ..., $MC_{16,3}$ and then $MC_{16,4}$ in a similar manner as in the case of the arrangement shown in FIG. 4. The data thus written in the MC's is all transferred to the latch flip-flops $LR_{1,1}$ to $LR_{16,4}$ at one time in response to the input latch signal CPLR.

Sixty four brightness control signals $DY_1$, $DY_2$, ..., $DY_{64}$ each of 4 bits are produced from the data output terminals Q of the flip-flops $LR_{1,1}$, ..., $LR_{16,4}$, respectively.

Figure 6:
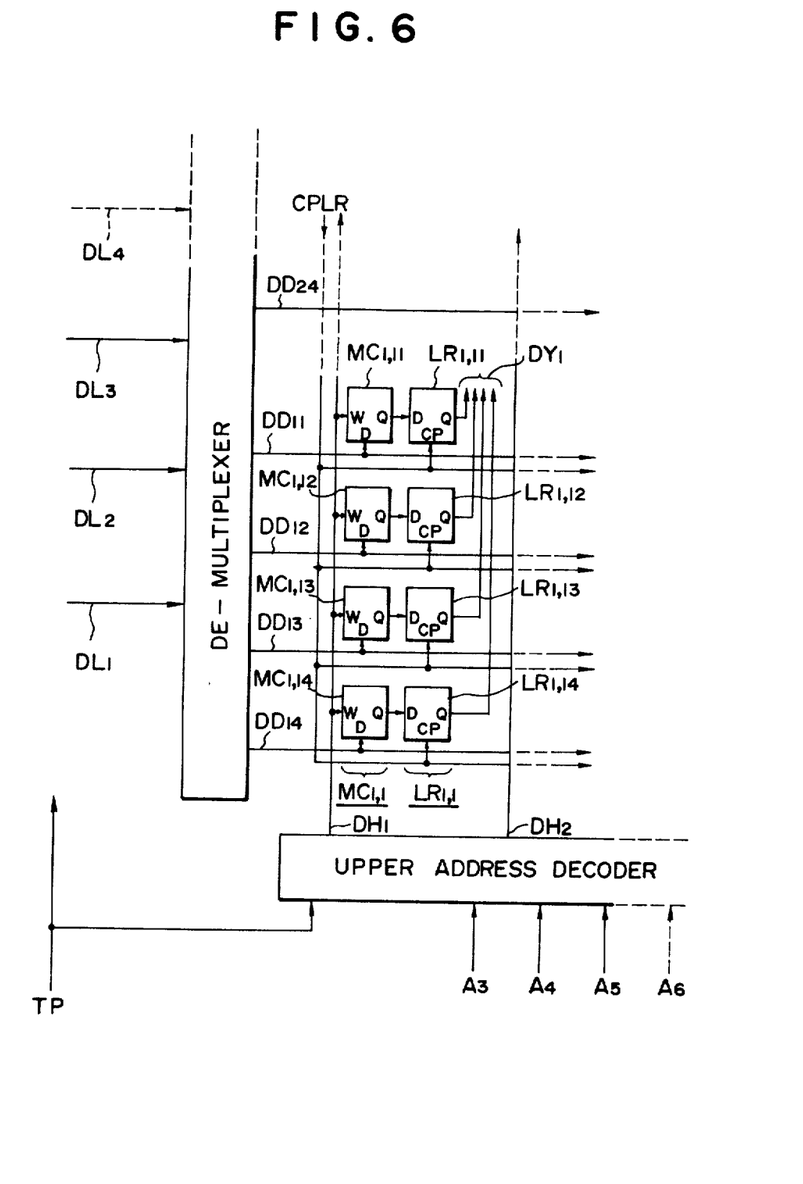
FIG. 6 is a block diagram to show in more detail a portion of the arrangement shown in FIG. 5.

FIG. 6 shows in some detail a typical circuit arrangement of the memory cell $MC_{1,1}$ and the flip-flop $LR_{1,1}$ of the line memory shown in FIG. 5.

It will be seen that the memory cell $MC_{1,1}$ is composed of single-bit memory cells $MC_{1,11}$, ..., $MC_{1,14}$ corresponding to bit lines $DD_{11}$, ..., $DD_{14}$, respectively.

In a similar manner, the flip-flop $LR_{1,1}$ is composed of flip-flops $LR_{1,11}$, ..., $LR_{1,14}$ corresponding to the memory cells $MC_{1,11}$, ..., $MC_{1,14}$, respectively.

When the row drive signal $DL_1$ becomes logic "1", the data signal DV is produced on the bit lines $DD_{11}$ to $DD_{14}$ and stored in the memory cells $MC_{1,11}$, ..., $MC_{1,14}$ when the column drive signal $DH_1$ is logic "1".

The contents in the individual memory cells $MC_{1,11}$, ..., $MC_{1,14}$ are transferred to the corresponding flip-flops $LR_{1,11}$, ..., $LR_{1,14}$ by the latch signal CPLR, resulting in generation of the four-bit brightness control signal $DY_1$ at the respective output terminals Q.

Next, examination will be made in respect of the power consumption of a device incorporating the circuit arrangement illustrated in FIG. 3 by comparing with a hitherto known shift register.

Power consumption P of a memory arrangement in which the hitherto known shift register is adopted can be given by the following expression:

$$P = EFN/H = Eln^2/H \quad (1)$$

where
E: energy required for a single-bit flip-flop to operate once,
H: scanning period for a single row = 63.5 μS,
F: number of write-in operations effected during a single scanning period (1H) = n, and
N: bit number of flip-flops operating at a single write-in operation.

In the case of the device according to the invention shown in FIG. 3, the address counter 11 can be implemented with only a nine bit capacity even when n=340 (generally, $\log_2 n$ bits are required). Although the first bit flip-flop $CN_1$ is operated n times during the single scanning period 1H, the second bit flip-flop $CN_2$ is operated n/2 times, the third bit $CN_3$ is operated n/4 times and so forth and finally the last bit flip-flop $CN_9$ is operated only twice. Accordingly, power consumption $P_{CN}$ of the address counter 11 is given by the following expression:

$$P_{CN} = E\left(n + \frac{n}{2} + \frac{n}{2} + \ldots + 2\right)/H \approx 2En/H \quad (2)$$

The address decoder 12 is constituted by logic gates having outputs in number of $2\sqrt{l \cdot n}$ with each output changing n times during 1H. Accordingly, the power consumption $P_{DC}$ of the address decoder may be expressed as follows:

$$P_{DC} = 2En\sqrt{l \cdot n}/H \quad (3)$$

In the case of the memory cell portion 13, only l bits are operative at a single write operation. Accordingly, the power consumption $P_{MC}$ of this portion 13 may be given by the following expression:

$$P_{MC} = Eln/H \quad (4)$$

In the latch register 20, all the bits of l·n in number are operative one during the period of 1H. Accordingly, the power consumption of the latch register 20 may be expressed as follows:

$$P_{LR} = Eln/H \quad (5)$$

In this connection, it will be understood that the power consumption of the higherto known shift register is far higher than that of the latch register 20 without resorting to a mathematical expression.

Accordingly, the total power consumption $P_o$ of the line memory shown in FIG. 3 can be given by the following expression:

$$P = P_{CN} + P_{DC} + P_{MC} + P_{LR} = 2En(3 + \sqrt{l \cdot n})/H \quad (6)$$

When the power consumption of the line memory according to the invention as given by the expression (6) is compared with that ($P_o$) of the hitherto known shift register as given by the expression (1) on the assumption that l=4 and n=340, the result will be as follows:

$$\frac{P_o}{P} = \frac{3En(3 + \sqrt{l \cdot n}/H)}{E \cdot l \cdot n^2/H} = \frac{2(3 + \sqrt{l \cdot n})}{l \cdot n} = \frac{1}{17} \quad (7)$$

In this manner, the arrangement of the line memory according to the present invention allows the power consumption to be reduced by a factor in the order of 10 or more over that of the higherto known shift register.

What is claimed is:

1. A serial-parallel signal converter for storing a serially input digital signal in a predetermined number of elements and producing the stored data as a parallel output digital signal at one time, comprising:
    an address counter for counting a timing pulse signal for commanding write-in operations of the serial digital signal thereby to produce address signals,
    a memory including a number of memory cells which can be designated by said address signals, wherein write-in operation of the digital signal is sequentially effected only to the memory cells having the addresses designated by said address signals, while read-out operation is effected such that contents stored in all the memory cells are read out parallelly at one time;
    an upper address decoder for decoding more significant address bits produced from said address counter;
    a lower address decoder for decoding less significant address bits produced from said address counter; and
    means for effecting selection of the memory cell to which the write-in operation is to be effected in dependence on the outputs from both of said upper address decoder and the lower address decoder.

2. A serial-parallel converter according to claim 1, wherein each of said memory cells has a first write enable gate terminal to which the output from said upper address decoder is applied, a second write enable gate terminal to which the output from said lower address decoder is applied, a data input terminal to which data to be written is supplied, and a data output terminal, whereby data supplied to said data input terminal is allowed to be written in the memory cell when a write enable signal is applied to both of said first and second write enable gate terminals.

3. A serial-parallel converter according to claim 1, wherein said memory comprises a number of memory cells disposed in an X-Y matrix array, the upper address decoder for decoding more significant address bits produced from said address counter being connected to said memory to select one of the Y-lines, and a demultiplexer for determining the X-line to which said serial digital signal is to be applied in dependence on the output from said lower address decoder, and wherein selection of the memory cell to which the write-in operation is to be effected is made in dependence on the outputs from said upper address decoder and said demultiplexer, said output of said demultiplexer providing the digital signal to be written at that time.

4. A serial-parallel converter according to claim 3, wherein each of said memory cells has a write enable gate terminal to which the output from said upper address decoder is applied, a data input terminal to which the output from said demultiplexer is applied, and a data output terminal.

5. A serial-parallel converter according to claim 4, wherein data output terminals of said individual memory cells are connected to data input terminals of flip-flops provided in correspondence to said memory cells and constituting a latch register, contents of all the memory cells being transferred to the corresponding flip-flops at one time in response to a latch signal, said parallely output digital signal being derived from the output terminals of said flip-flops.

6. A line memory of converting a serial digital video signal input serially to a predetermined number of storage elements into a brightness command signal corresponding to a single scanning line of a display panel, comprising:
    an address counter for counting a write timing pulse signal synchronized with the serial digital video signal, and
    a memory including a number of memory cells which can be designated by said address counter and flip-flops provided in correspondence to said memory cells and constituting a latch register;
    an upper address decoder for decoding more significant address bits of said address counter;
    a lower address decoder for decoding less significant address bits of said address counter; and
    means for effecting selection of the memory cell to which the write-in operation is to be effected in dependence on the outputs from said upper and lower address decoders, thereby to write the current digital video signal into the memory cell selected at that time;
    wherein write-in operation of said digital video signal is sequentially effected only to the memory cells of the addresses designated by said address counter, while upon completion of the write-in operation to all of said memory cells, contents stored in all of said memory cells are transferred at one time to corresponding ones of said flip-flops, the output from which serves as said brightness command signal.

7. A line memory according to claim 6, wherein said memory comprises a matrix array of memory cells disposed in X-lines and Y-lines, the upper address decoder for decoding more significant address bits of said address counter being connected to said memory to thereby select one of said Y-lines, and a demultiplexer for determining the X-line of said matrix array to which said digital video signal is to be supplied in dependence on the output of said lower address decoder, whereby selection of the memory cell disposed in the X-Y matrix array is effected in dependence on the outputs from said upper address decoder and said demultiplexer to thereby apply the digital video signal to the X-line corresponding to the selected memory cell.

* * * * *